(12) United States Patent
Guo

(10) Patent No.: US 11,069,865 B2
(45) Date of Patent: Jul. 20, 2021

(54) FLEXIBLE DISPLAY PANEL AND FABRICATION METHOD THEREOF

(71) Applicant: Wuhan China Star Optoelectronics Semiconductor Display Technology Co. Ltd., Wuhan (CN)

(72) Inventor: Tianfu Guo, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 40 days.

(21) Appl. No.: 16/349,262

(22) PCT Filed: Dec. 19, 2018

(86) PCT No.: PCT/CN2018/122192
§ 371 (c)(1),
(2) Date: May 12, 2019

(87) PCT Pub. No.: WO2020/118747
PCT Pub. Date: Jun. 18, 2020

(65) Prior Publication Data
US 2020/0203639 A1      Jun. 25, 2020

(51) Int. Cl.
*H01L 51/00* (2006.01)
*H01L 27/12* (2006.01)
(Continued)

(52) U.S. Cl.
CPC ...... *H01L 51/0097* (2013.01); *H01L 27/1218* (2013.01); *H01L 27/3244* (2013.01);
(Continued)

(58) Field of Classification Search
CPC ............. H01L 51/005; H01L 2227/323; H01L 2227/326; H01L 51/5008; C08J 5/18;
(Continued)

(56) References Cited

U.S. PATENT DOCUMENTS 3,387,035 A * 6/1968 Gray ..................... C07C 45/46
568/333
2015/0099131 A1* 4/2015 Sun ....................... C08G 69/32
428/435

(Continued)

FOREIGN PATENT DOCUMENTS

WO    WO-2018143588 A1 *  8/2018  ............. B32B 27/08

*Primary Examiner* — Fernando L Toledo
*Assistant Examiner* — Valerie N Newton

(57) ABSTRACT

The invention provides a flexible display panel and a fabricating method thereof. The flexible display panel includes a flexible substrate, one or more layers of a laser absorbing layer disposed in the flexible substrate, and a display functional layer disposed on the flexible substrate, the laser absorbing layer containing a fluorine-containing aromatic organic compound as an ultraviolet light absorber. The fluorine-containing aromatic organic compound used the ultraviolet light absorbing agent has strong ultraviolet light absorbing ability, and is chemically stable, and can be stably present in a flexible substrate, thereby being capable of absorbing excess laser energy in the LLO process and preventing the excess laser energy in the LLO process from further carbonizing the display functional layer on the flexible substrate. Thus, the LLO process yield of the flexible display panel is effectively improved and the yield of the product is greatly improved as a result.

8 Claims, 5 Drawing Sheets

(51) Int. Cl.
*H01L 27/32* (2006.01)
*H01L 51/52* (2006.01)
*H01L 51/56* (2006.01)

(52) U.S. Cl.
CPC .......... *H01L 51/003* (2013.01); *H01L 51/005* (2013.01); *H01L 51/5253* (2013.01); *H01L 51/56* (2013.01); *H01L 27/1266* (2013.01); *H01L 2227/323* (2013.01); *H01L 2227/326* (2013.01)

(58) Field of Classification Search
CPC ................ C09D 177/00; B32B 43/006; C08G 73/1039; G09F 9/301
See application file for complete search history.

(56) References Cited

U.S. PATENT DOCUMENTS

2015/0210048 A1* 7/2015 Jeong ........................ B32B 7/02
428/212
2020/0062906 A1* 2/2020 Jeong .................... B32B 43/006

* cited by examiner providing a glass substrate, a first polymer solution, and a second polymer solution, coating the first polymer solution on the glass substrate, and then alternately coating the second polymer solution and the first polymer solution at least once, and curing the first polymer solution and the second polymer solution by baking to form a flexible substrate from the first polymer solution and to form one or more laser absorbing layers in the flexible substrate from the second polymer solution;
wherein the one or more laser absorbing layers comprise a fluorine-containing aromatic organic compound used as an ultraviolet light absorber; — S1 forming a display functional layer on the flexible substrate; — S2 scanning a side of the glass substrate of the flexible substrate with a laser to separate the flexible substrate from the glass substrate, such that the flexible substrate is peeled off from the glass substrate. — S3

FIG. 6

FLEXIBLE DISPLAY PANEL AND FABRICATION METHOD THEREOF

RELATED APPLICATIONS

This application is a National Phase of PCT Patent Application No. PCT/CN2018/122192 having International filing date of Dec. 19, 2018, which claims the benefit of priority of Chinese Patent Application No. 201811506853.7 filed on Dec. 10, 2018. The contents of the above applications are all incorporated by reference as if fully set forth herein in their entirety.

FIELD AND BACKGROUND OF THE INVENTION

The present invention relates to the field of display technologies, and in particular, to a flexible display panel and a fabricating method thereof.

Organic light emitting diode (OLED) displays have advantages of self-luminescence, low driving voltage, high luminous efficiency, short response times, high definition and contrast ratio, near 180° viewing angles, wide operating temperature range, flexible display, large area with full-color display, and so on, and is recognized by the industry as the most promising display device.

Organic light emitting diode (OLED) display technology is different from traditional liquid crystal display technology. It does not require a backlight, and uses a very thin coating of organic materials and a glass substrate. When current passes, these organic materials will emit light. However, because the organic materials easily react with water vapor or oxygen, the organic material-based organic light emitting diode (OLED) display has a very high packaging requirement. Therefore, the sealing of the OLED device is improved by the packaging of the OLED device, and isolation from the external environment as much as possible is critical for stable illumination of OLED devices.

For OLED devices, the most competitive advantage is the ability to make flexible devices, which will bring huge reforms to the device-related electronics industry. In order to obtain a flexible OLED device, it is first necessary to replace the traditional rigid glass substrate with a flexible substrate. However, in view of practical operability, the industry chooses to first make the flexible substrate on a surface of a rigid glass substrate, and after all the processes are completed, the flexible substrate is peeled off from the surface of the glass substrate by a laser lift off (LLO) process, thereby achieving the object of fabricating a flexible OLED device. From the above description, it can be found that the LLO process is a key process in the production of flexible OLED devices, and how to effectively improve the yield of the process is extremely critical.

A flexible OLED display is a flexible display device made of a flexible substrate, usually a flexible polyimide (PI) substrate. After completing all the processes on the glass substrate, the OLED display panel begins to enter the LLO section. The specific principle is to irradiate the bottom glass substrate by laser to carbonize the flexible PI substrate attached to the glass substrate, and weaken an interaction between the glass and the flexible PI substrate, to achieve the object of peeling off the flexible OLED display panel from the glass substrate.

Laser wavelength commonly used in the LLO process is 308 nm, which belongs to ultraviolet light. However, in the actual peeling-off process, the LLO process is prone to large yield loss, mainly due to the following reasons: 1. There is a foreign matter between the glass substrate and the flexible PI substrate, or the glass substrate itself has defects, so that a strong force is still remained between the local flexible PI substrate and the glass substrate after laser irradiation, and the flexible substrate cannot be peeled off normally. 2. The flexible PI substrate itself has defects, and the ultraviolet laser can easily pass through the flexible PI substrate, causing laser energy in some areas to penetrate the upper film layer, resulting damage to the OLED structure and thin film transistor (TFT) structure. The existence of the inevitable factors will always bring great challenges to the LLO process, which will seriously impact process yield.

In order to solve the above problems, one existing solution is to dope a material having ultraviolet absorbing ability into a flexible substrate, to prevent the upper layer structure form possible burn by excess ultraviolet light. However, the general ultraviolet light absorber itself is unstable, easily decomposes under an action of ultraviolet light to produce a series of by-products, which is directly introduced into PI, causing many unintended consequences. Therefore, it is extremely important to introduce a stable UV absorber into a flexible substrate for improving yield of the LLO process.

SUMMARY OF THE INVENTION

An object of the present invention is to provide a flexible display panel that can prevent excess laser energy in the LLO process from further carbonizing display functional layers of upper layers, thereby effectively improving yield of the flexible display panel in the LLO process.

An object of the present invention is to provide a method of fabricating a flexible display panel, which can prevent excess laser energy in the LLO process from further carbonizing display functional layers of upper layers, thereby effectively improving yield of the flexible display panel in the LLO process.

To achieve the above objects, the present invention provides a flexible display panel including a flexible substrate, one or more laser absorbing layers disposed in the flexible substrate, and a display functional layer disposed on the flexible substrate; the one or more laser absorbing layers comprise wherein the one or more laser absorbing layers comprise a fluorine-containing aromatic organic compound used as an ultraviolet light absorber.

The flexible substrate is made from a first polymer solution;

The one or more laser absorbing layers is made from a second polymer solution, and the second polymer solution includes the first polymer solution and an aromatic organic compound mixed in the first polymer solution.

The fluorine-containing aromatic organic compound includes 2,4-dihydroxybenzophenone substituted with a fluorine-containing functional group.

A molecular structure of the fluorine-containing aromatic organic compound comprises a trifluoromethyl group.

The flexible substrate is a polyimide substrate; and the display functional layer comprises a thin film transistor (TFT) layer, an organic light emitting diode (OLED) layer, and a thin film encapsulation layer which are sequentially stacked on the flexible substrate.

The invention also provides a method of fabricating a flexible display panel, including the following steps:

Step S1, providing a glass substrate, a first polymer solution and a second polymer solution, coating the first polymer solution on the glass substrate, and then alternately coating the second polymer solution and the first polymer solution at least once, and curing the first and second polymer solutions by baking to form a flexible substrate from the first polymer solution and to form one or more laser absorbing layers in the flexible substrate from the second polymer solution; wherein the one or more laser absorbing layers comprises a fluorine-containing aromatic organic compound used as an ultraviolet light absorber;

Step S2, forming a display functional layer on the flexible substrate;

Step S3: scanning a side of the glass substrate of the flexible substrate with a laser to separate the flexible substrate from the glass substrate such that the flexible substrate is peeled off from the glass substrate.

The second polymer solution provided in the step S1 comprises a first polymer solution and an aromatic organic compound mixed in the first polymer solution.

The fluorine-containing aromatic organic compound comprises 2,4-dihydroxybenzophenone substituted with a fluorine-containing functional group.

A molecular structure of the fluorine-containing aromatic organic compound comprises a trifluoromethyl group.

The flexible substrate formed in the step S1 is a polyimide substrate; and the display functional layer formed in the step S2 comprises a thin film transistor (TFT) layer, an organic light emitting diode (OLED) layer and a thin film encapsulation layer which are sequentially stacked on the flexible substrate; wherein the laser used in the step S3 has a wavelength of 308 nm.

Advantageous effects of the present invention: the present invention provides a flexible display panel including a flexible substrate, one or more layers of a laser absorbing layer disposed in the flexible substrate, and a display functional layer disposed on the flexible substrate, and the one or more laser absorbing layers include a fluorine-containing aromatic organic compound used as an ultraviolet light absorber, the ultraviolet light absorbing agent of the fluorine-containing aromatic organic compound has strong ultraviolet light absorbing ability, and is chemically stable, and can be stably present in a flexible substrate, thereby being capable of absorbing the excess laser energy in the LLO process, thus preventing excess laser energy in the LLO process from further carbonizing display functional layers of upper layers, thereby effectively improving yield of the flexible display panel in the LLO process, greatly improving the product yield. The invention provides a method of fabricating a flexible display panel, which includes disposing a laser absorbing layer containing an ultraviolet light absorbing agent in a flexible substrate, wherein the ultraviolet light absorbing agent is the fluorine-containing aromatic organic compound having strong ultraviolet light absorbing ability, and is chemically stable, and can be stably present in a flexible substrate, thereby being capable of absorbing the excess laser energy in the LLO process and preventing the excess laser energy in the LLO process from further carbonizing display functional layers on the flexible substrate, thus effectively improving yield of the flexible display panel in the LLO process, greatly improving the product yield.

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

BRIEF DESCRIPTION OF THE SEVERAL VIEWS OF THE DRAWINGS

Hereinafter, embodiments of the present invention will be explained in detail with reference to the accompanying drawings.

FIG. 6 is a schematic flow chart of the method of fabricating a flexible display panel of the present invention.

DESCRIPTION OF SPECIFIC EMBODIMENTS OF THE INVENTION

In order to further clarify the technical means and effects of the present invention, the following detailed description will be made in conjunction with the preferred embodiments of the invention and the accompanying drawings.

Figure 1:
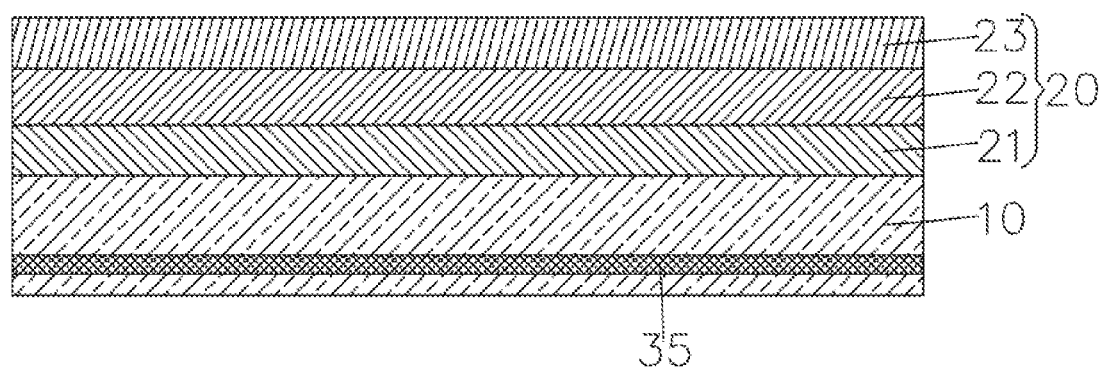
FIG. 1 is a schematic structural view of a flexible display panel of the present invention.

Referring to FIG. 1, the present invention first provides a flexible display panel, including a flexible substrate 10, one or more layers of a laser absorbing layer 35 disposed in the flexible substrate 10, and a display functional layer 20 disposed on the flexible substrate 10.

The laser absorbing layer 35 includes a fluorine-containing aromatic organic compound used as an ultraviolet light absorber.

Figure 2:
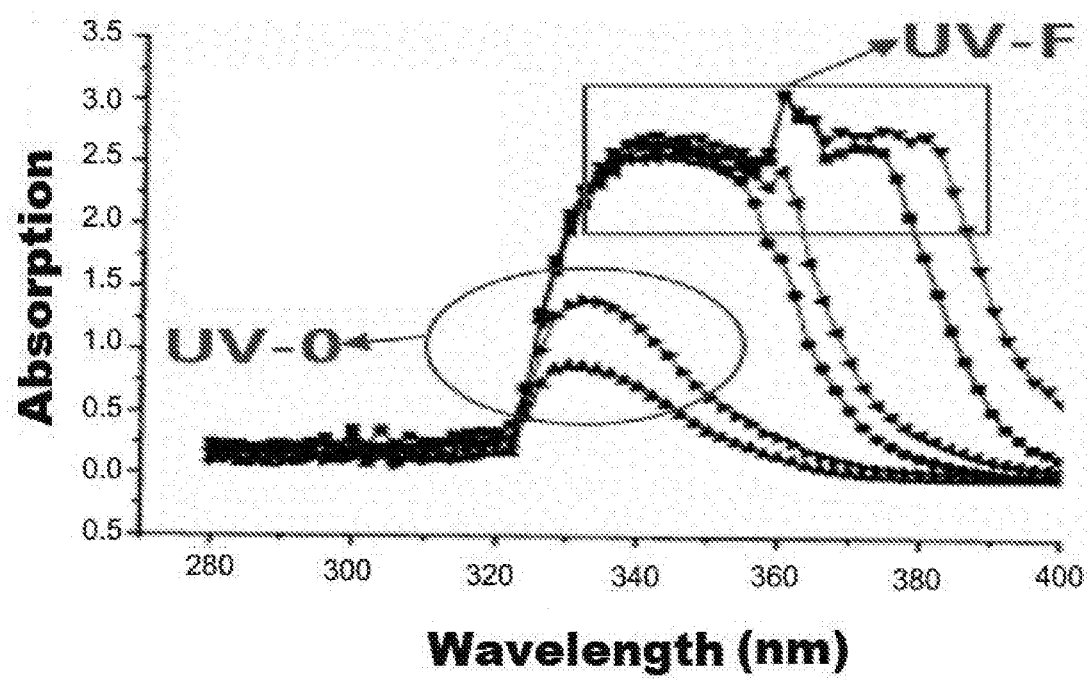
FIG. 2 is a UV absorption spectrum of 2,4-dihydroxybenzophenone and a 2,4-dihydroxybenzophenone substituted with a fluorine-containing functional group.

It should be noted that common ultraviolet absorbers themselves are chemically unstable, easily decompose under the action of ultraviolet light to produce a series of by-products, which are directly introduced into the flexible substrate 10, causing many unintended consequences. By introducing a fluorine-containing functional group into a common ultraviolet absorber, the stability of the absorbent can be excellently increased, and among a variety of fluorine-containing ultraviolet absorbers, fluorine-containing aromatic organic compounds are relatively stable, such as 2,4-dihydroxybenzophenone substituted with a fluorine-containing functional group or the like. In FIG. 2, the 2,4-dihydroxybenzophenone referred to as UV-0, and the 2,4-dihydroxybenzophenone substituted with a fluorine-containing functional group referred to as UV-F have different concentrations, and it can be found from the ultraviolet absorption spectrum shown in FIG. 2 that the ultraviolet absorption property is greatly improved after introducing a fluorine atom into the conventional ultraviolet absorber UV-0, resulting in superior ultraviolet light absorbing ability.

Specifically, the flexible substrate 10 is made from a first polymer solution. In this embodiment, the flexible substrate 10 is a polyimide substrate, and the first polymer solution is a polyimide solution.

Specifically, the laser absorbing layer 35 is made from a second polymer solution, and the second polymer solution includes a first polymer solution and an aromatic organic compound mixed in the first polymer solution. The second polymer solution may be obtained by doping a first polymer solution with a small molecule, fluorine-containing aromatic organic compound, or by modifying the polyimide through introducing a fluorine-containing aromatic functional group into its chemical structure to obtain a macromolecular aromatic organic compound, thereby obtaining a second polymer solution from the macromolecular aromatic organic compound, to form a laser absorbing layer 35.

Specifically, the fluorine-containing functional group in the fluorine-containing aromatic organic compound includes a trifluoromethyl group and the like.

Specifically, in the present embodiment, the fluorine-containing aromatic organic compound includes 2,4-dihydroxybenzophenone substituted with a fluorine-containing functional group.

Specifically, the display functional layer 20 includes a thin film transistor (TFT) layer 21, an organic light emitting diode (OLED) layer 22, and a thin film encapsulation layer 23 which are sequentially stacked on the flexible substrate 10.

Figure 3:
FIG. 3 is a schematic structural view showing a laser absorbing layer provided in a flexible substrate of a flexible display panel of the present invention.
Figure 4:
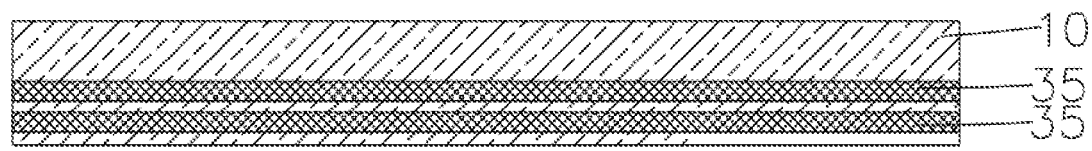
FIG. 4 is a schematic structural view showing two laser absorbing layers in a flexible substrate of a flexible display panel of the present invention.
Figure 5:
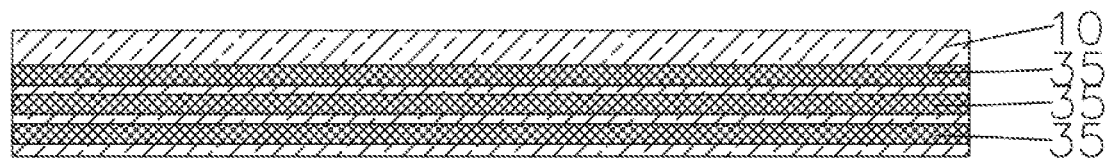
FIG. 5 is a schematic structural view showing three laser absorbing layers in a flexible substrate of a flexible display panel of the present invention.

Specifically, as shown in FIGS. 3-5, one, two, three, or more laser absorbing layers 35 may be disposed in the flexible substrate 10, and more specifically, disposed relatively far from the display functional layer 20 in the flexible substrate 10. That is, a thickness of an area of the flexible substrate 10 where the laser absorbing layer 35 is closest to the display functional layer 20 is larger than a thickness of another area of the flexible substrate 10 where the laser absorbing layer 35 is farthest from the display functional layer 20.

Specifically, the TFT layer 21 is used to drive the OLED layer 22, including a plurality of arrayed TFT devices, which are low temperature poly-silicon (LTPS) type or metal-oxide semiconductor (MOS) type, such as indium gallium zinc oxide (IGZO) MOS.

Specifically, the OLED layer 22 includes a first electrode layer disposed on the TFT layer 21, a pixel definition layer disposed on the TFT layer 21 and the first electrode layer, an organic functional layer disposed on the first electrode layer, and a second electrode layer (not shown) disposed on the pixel definition layer and the organic functional layer. The pixel definition layer encloses a plurality of pixel openings arranged in an array on the first electrode layer; the organic functional layer is disposed in the pixel openings; in each pixel opening, the organic functional layer, the first electrode correspondingly below the organic functional layer, and the second electrode correspondingly above the organic functional layer together constitute an OLED device.

Specifically, the first electrode layer and the second electrode layer are respectively used as an anode and a cathode of the OLED device; and the organic functional layer includes a hole injection layer, a hole transport layer, a light emitting layer, an electron transport layer, and an electron injection layer, which are sequentially disposed from bottom to top.

Specifically, the thin film encapsulation layer 23 includes an inorganic barrier layer and an organic buffer layer (not shown) which are stacked.

In the flexible display panel of the present invention, one or more laser absorbing layers 35 are disposed in the flexible substrate 10, and include fluorine-containing aromatic organic compounds used as ultraviolet light absorbing agents, which have extremely strong ultraviolet light absorbing ability compared with common ultraviolet light absorbing agents, and is chemically stable and stably present in a flexible substrate 10, thereby being capable of absorbing the excess laser energy in the LLO process, thus preventing excess laser energy in the LLO process from further carbonizing the display functional layer 20 on the flexible substrate 10, thereby effectively improving yield of the flexible display panel in the LLO process, greatly improving the product yield.

Figure 7:
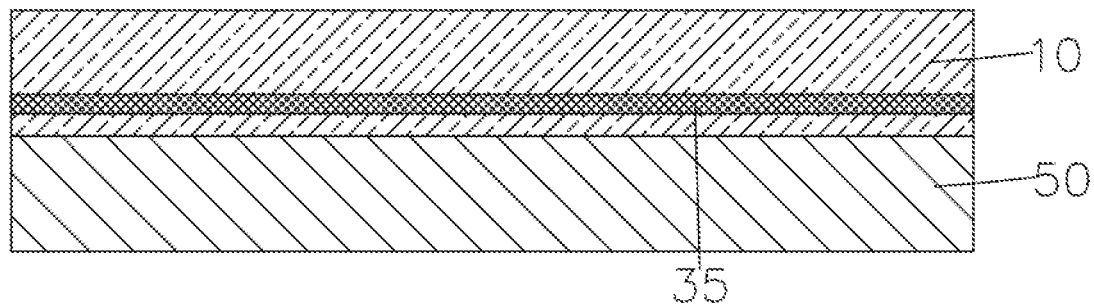
FIG. 7 is a schematic diagram of step S1 of the method of fabricating a flexible display panel of the present invention.

Based on the flexible display panel described above, referring to FIG. 6, the present invention further provides a method of fabricating a flexible display panel, which includes the following steps:

Step S1, as shown in FIG. 7, providing a glass substrate 50, a first polymer solution, and a second polymer solution, coating the first polymer solution on the glass substrate 50, and then alternately coating the second polymer solution and the first polymer solution at least once, and curing the first and second polymer solutions by baking to form a flexible substrate 10 from the first polymer solution, and to form one or more laser absorbing layers 35 in the flexible substrate from the second polymer solution.

The laser absorbing layer 35 includes a fluorine-containing aromatic organic compound used as an ultraviolet light absorbing agent, and the ultraviolet light absorbing agent of the fluorine-containing aromatic organic compound has a strong ultraviolet light absorbing ability compared to common ultraviolet light absorbing agents, and is chemically stable and stably present in the flexible substrate 10.

Specifically, the second polymer solution provided in the step S1 comprises a first polymer solution and an aromatic organic compound mixed in the first polymer solution. In this embodiment, the flexible substrate 10 is a polyimide substrate, and the first polymer solution is a polyimide solution.

Specifically, the second polymer solution may be obtained by doping a small molecule, fluorine-containing aromatic organic compound into the first polymer solution; or by modifying the polyimide through introducing a fluorine-containing aromatic functional group into its chemical structure to obtain a macromolecular aromatic organic compound, thereby obtaining a second polymer solution from the macromolecular aromatic organic compound, to form a laser absorbing layer 35.

Specifically, the fluorine-containing functional group in the fluorine-containing aromatic organic compound includes a trifluoromethyl group and the like.

Specifically, in the present embodiment, the fluorine-containing aromatic organic compound includes 2,4-dihydroxybenzophenone substituted with a fluorine-containing functional group.

Specifically, one, two, three, or more laser absorbing layers 35 may be disposed in the flexible substrate 10, and more specifically, disposed relatively far from the display functional layer 20 in the flexible substrate 10. That is, a thickness of an area of the flexible substrate 10 where the laser absorbing layer 35 is closest to the display functional layer 20 is larger than a thickness of another area of the flexible substrate 10 where the laser absorbing layer 35 is farthest from the display functional layer 20.

Figure 8:
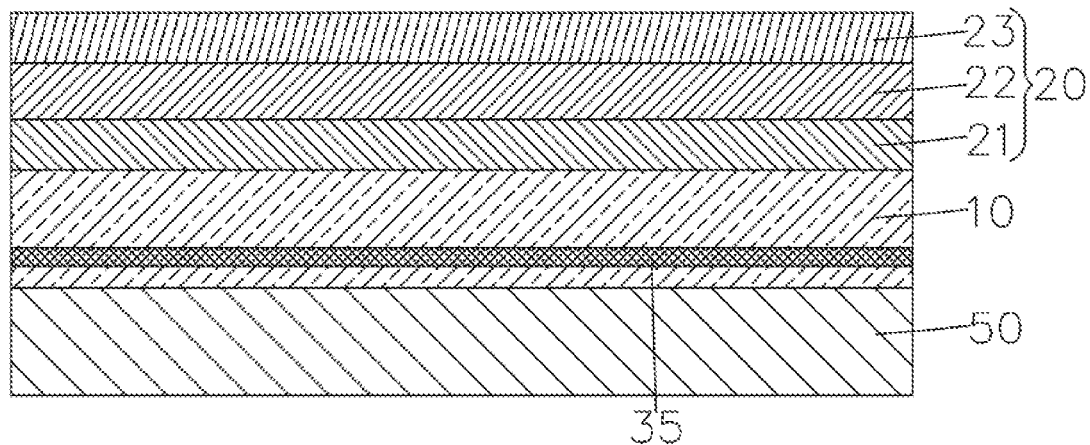
FIG. 8 is a schematic diagram of step S2 of the method of fabricating a flexible display panel of the present invention.

Step S2, as shown in FIG. 8, a display functional layer 20 is formed on the flexible substrate 10.

Specifically, the display functional layer 20 includes a thin film transistor (TFT) layer 21, an organic light emitting diode (OLED) layer 22, and a thin film encapsulation layer 23 which are sequentially stacked on the flexible substrate 10.

Specifically, the TFT layer 21 is used to drive the OLED layer 22, including a plurality of arrayed TFT devices, which are low temperature poly-silicon (LTPS) type or metal-oxide semiconductor (MOS) type such as indium gallium zinc oxide (IGZO) MOS.

Specifically, the OLED layer 22 includes a first electrode layer disposed on the TFT layer 21, a pixel definition layer disposed on the TFT layer 21 and the first electrode layer, an organic functional layer disposed on the first electrode layer, and a second electrode layer (not shown) disposed on the pixel definition layer and the organic functional layer. The pixel definition layer encloses a plurality of pixel openings arranged in an array on the first electrode layer; the organic functional layer is disposed in the pixel openings; in each pixel opening, the organic functional layer, the first electrode correspondingly below the organic functional layer, and the second electrode correspondingly above the organic functional layer together constitute an organic light emitting diode (OLED) device.

Specifically, the first electrode layer and the second electrode layer are respectively used as an anode and a cathode of the OLED device; the organic functional layer includes a hole injection layer, a hole transport layer, a light emitting layer, an electron transport layer, and an electron injection layer, which are sequentially disposed from bottom to top.

Specifically, the thin film encapsulation layer 23 includes an inorganic barrier layer and an organic buffer layer (not shown) which are stacked.

Figure 9:
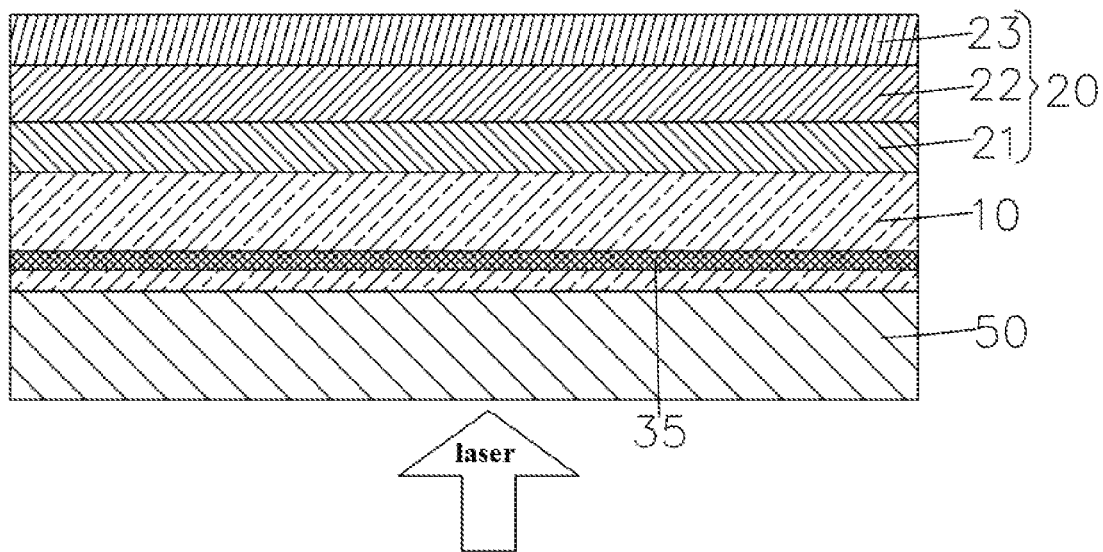
FIGS. 9-10 are schematic diagrams of the step S3 of the method of fabricating a flexible display panel of the present invention.
Figure 10:
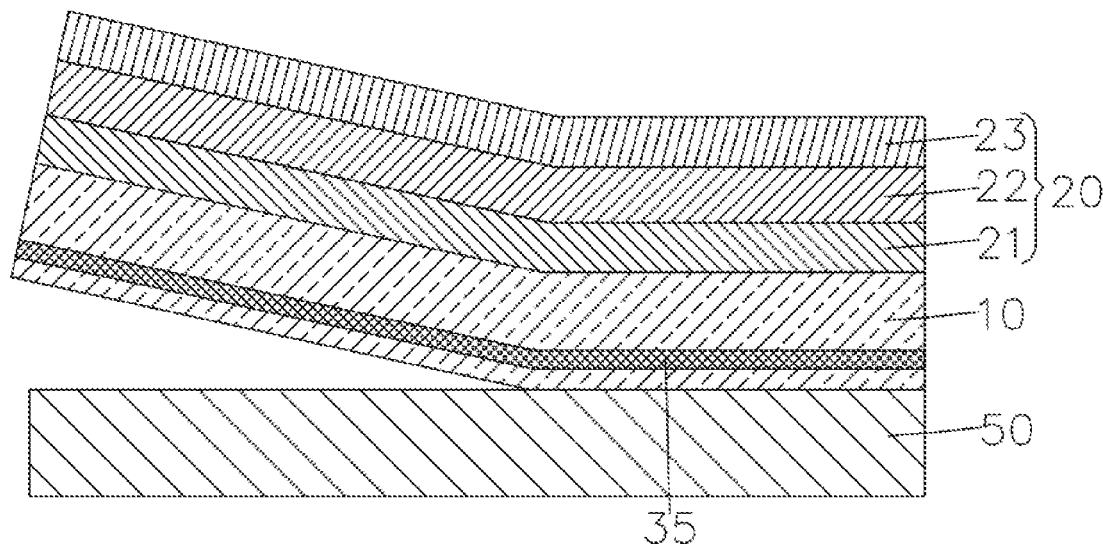

Step S3, as shown in FIGS. 9-10, scanning a side of the glass substrate 50 of the flexible substrate 10 with a laser to separate the flexible substrate 10 from the glass substrate 50, such that the flexible substrate 10 is peeled off from the glass substrate 50.

Specifically, the wavelength of the laser light used in the step S3 is 308 nm.

The method of fabricating the flexible display panel of the present invention includes: providing a laser absorbing layer 35 including an ultraviolet light absorbing agent in the flexible substrate 10, the laser absorbing layer 35 is a fluorine-containing aromatic organic compound, which have extremely strong ultraviolet light absorbing ability compared with common ultraviolet light absorbing agents, and is chemically stable and stably present in a flexible substrate 10, thereby being capable of absorbing the excess laser energy in the LLO process, thus preventing excess laser energy in the LLO process from further carbonizing the display functional layer 20 on the flexible substrate 10, thereby effectively improving yield of the flexible display panel in the LLO process, greatly improving the product yield.

In summary, the present invention provides a flexible display panel including a flexible substrate, one or more layers of a laser absorbing layer disposed in the flexible substrate, and a display functional layer disposed on the flexible substrate, and the one or more laser absorbing layers include a fluorine-containing aromatic organic compound used as an ultraviolet light absorber. The fluorine-containing aromatic organic compound has strong ultraviolet light absorbing ability, and is chemically stable, and can be stably present in a flexible substrate, thereby being capable of absorbing the excess laser energy in the LLO process, thus preventing excess laser energy in the LLO process from further carbonizing display functional layers on the flexible substrate, thereby effectively improving yield of the flexible display panel in the LLO process, greatly improving the product yield. The invention provides a method of fabricating a flexible display panel, which includes disposing a laser absorbing layer containing an ultraviolet light absorbing agent in a flexible substrate, wherein the ultraviolet light absorbing agent is the fluorine-containing aromatic organic compound having strong ultraviolet light absorbing ability, and is chemically stable, and can be stably present in a flexible substrate, thereby being capable of absorbing the excess laser energy in the LLO process prevents the excess laser energy in the LLO process from further carbonizing display functional layers on the flexible substrate, thus effectively improving yield of the flexible display panel in the LLO process, greatly improving the product yield While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. A flexible display panel, comprising a flexible substrate, one or more laser absorbing layers disposed in the flexible substrate, and a display functional layer disposed on the flexible substrate;
    wherein the one or more laser absorbing layers comprise a fluorine-containing aromatic organic compound used as an ultraviolet light absorber, and the fluorine-containing aromatic organic compound comprises 2,4-dihydroxybenzophenone substituted with a fluorine-containing functional group.

2. The flexible display panel according to claim 1, wherein the flexible substrate is made of a first polymer solution, the one or more laser absorbing layers are made of a second polymer solution, and the second polymer solution comprises the first polymer solution and an aromatic organic compound mixed in the first polymer solution.

3. The flexible display panel according to claim 1, wherein a molecular structure of the fluorine-containing aromatic organic compound comprises a trifluoromethyl group.

4. The flexible display panel according to claim 1, wherein the flexible substrate is a polyimide substrate; and
    the display functional layer comprises a thin film transistor (TFT) layer, an organic light emitting diode (OLED) layer, and a thin film encapsulation layer, which are sequentially stacked on the flexible substrate.

5. A method of fabricating a flexible display panel, comprising:
    Step S1, providing a glass substrate, a first polymer solution, and a second polymer solution, coating the first polymer solution on the glass substrate, and then alternately coating the second polymer solution and the first polymer solution at least once, and curing the first polymer solution and the second polymer solution by baking to form a flexible substrate from the first polymer solution and to form one or more laser absorbing layers in the flexible substrate from the second polymer solution;
    wherein the one or more laser absorbing layers comprise a fluorine-containing aromatic organic compound used as an ultraviolet light absorber, and the fluorine-containing aromatic organic compound comprises 2,4- dihydroxybenzophenone substituted with a fluorine-containing functional group;

Step S2, forming a display functional layer on the flexible substrate;

Step S3: scanning a side of the glass substrate of the flexible substrate with a laser to separate the flexible substrate from the glass substrate, such that the flexible substrate is peeled off from the glass substrate.

6. The method of fabricating the flexible display panel according to claim 5, wherein the second polymer solution provided in the step S1 comprises a first polymer solution and an aromatic organic compound mixed in the first polymer solution.

7. The method of fabricating the flexible display panel according to claim 5, wherein a molecular structure of the fluorine-containing aromatic organic compound comprises a trifluoromethyl group.

8. The method of fabricating the flexible display panel according to claim 5, wherein the flexible substrate formed in the step S1 is a polyimide substrate; and the display functional layer formed in the step S2 comprises a TFT layer, an OLED layer and a thin film encapsulation layer, which are sequentially stacked on the flexible substrate;

wherein the laser used in the step S3 has a wavelength of 308 nm.

* * * * *

UNITED STATES PATENT AND TRADEMARK OFFICE
CERTIFICATE OF CORRECTION

| | |
|---|---|
| PATENT NO. | : 11,069,865 B2 |
| APPLICATION NO. | : 16/349262 |
| DATED | : July 20, 2021 |
| INVENTOR(S) | : Tianfu Guo |

It is certified that error appears in the above-identified patent and that said Letters Patent is hereby corrected as shown below:

On the Title Page

Insert the following:
-- (30) Foreign Application Priority Data
Dec. 10, 2018 (CN) ................. 201811506853.7 --

Signed and Sealed this
Twentieth Day of September, 2022

*Katherine Kelly Vidal*

Katherine Kelly Vidal
*Director of the United States Patent and Trademark Office*